[12] United States Patent
Gluschenkov et al.

(10) Patent No.: US 6,838,334 B1
(45) Date of Patent: Jan. 4, 2005

(54) METHOD OF FABRICATING A BURIED COLLAR (75) Inventors: Oleg Gluschenkov, Poughkeepsie, NY (US); Chung-Yung Sung, Poughkeepsie, NY (US); Helmut H. Tews, Munich (DE)

(73) Assignees: International Business Machines Corporation, Armonk, NY (US); Infineon Technologies North America Corp., San Jose, CA (US)

( * ) Notice: Subject to any disclaimer, the term of this patent is extended or adjusted under 35 U.S.C. 154(b) by 5 days.

(21) Appl. No.: 10/604,562

(22) Filed: Jul. 30, 2003

(51) Int. Cl.[7] .......................................... H01L 21/8242
(52) U.S. Cl. ...................................... 438/243; 438/386
(58) Field of Search ............................... 438/243–249, 438/386–392; 257/301–305

(56) References Cited

U.S. PATENT DOCUMENTS

| 5,482,883 | A | | 1/1996 | Rajeevakumar | |
|---|---|---|---|---|---|
| 5,656,535 | A | | 8/1997 | Ho et al. | |
| 5,658,816 | A | | 8/1997 | Rajeevakumar | |
| 6,040,213 | A | * | 3/2000 | Canale et al. | 438/243 |
| 6,204,527 | B1 | * | 3/2001 | Sudo et al. | 257/301 |
| 6,326,658 | B1 | * | 12/2001 | Tsunashima et al. | 257/301 |
| 6,423,594 | B1 | * | 7/2002 | Tsai et al. | 438/243 |
| 6,455,886 | B1 | * | 9/2002 | Mandelman et al. | 257/301 |
| 6,458,647 | B1 | | 10/2002 | Tews et al. | |
| 6,486,024 | B1 | | 11/2002 | Tews et al. | |
| 6,534,376 | B2 | | 3/2003 | Tews | |
| 6,544,855 | B1 | | 4/2003 | Tews et al. | |
| 6,605,504 | B1 | * | 8/2003 | JaiPrakash et al. | 438/243 |
| 6,734,484 | B2 | * | 5/2004 | Wu | 257/301 |
| 6,770,928 | B2 | * | 8/2004 | Sommer et al. | 257/301 |
| 2002/0086481 | A1 | * | 7/2002 | Tsai et al. | 438/243 |
| 2002/0135007 | A1 | * | 9/2002 | Koike et al. | 257/301 |
| 2003/0020110 | A1 | | 1/2003 | Tews et al. | |
| 2003/0036241 | A1 | | 2/2003 | Tews | |

FOREIGN PATENT DOCUMENTS

| DE | 10255846 A1 | * | 4/2004 | ....... H01L/21/8242 |
| EP | 00848418 A2 | * | 6/1998 | ....... H01L/21/3205 |

* cited by examiner

Primary Examiner—John F. Niebling
Assistant Examiner—Jennifer M. Kennedy
(74) Attorney, Agent, or Firm—Schmeiser, Olsen & Watts; Steven Capella

(57) ABSTRACT

A method of forming a buried collar on the sidewall of a trench in a semiconductor substrate including: (a) providing the trench in the semiconductor substrate, the trench having a first dielectric layer formed on a sidewall in a upper region of the trench and a conductive material filling a lower region of the trench, the conductive material covering a lower portion of the first dielectric layer; (b) removing the first dielectric layer not covered by the conductive material; (c) forming a second dielectric layer on the exposed sidewall of the upper region and on a top surface of the conductive material; (d) removing an uppermost portion of the second dielectric layer from the sidewall in the upper region; (e) forming a third dielectric layer on the exposed sidewall of the upper region; and (f) increasing the thickness of the second dielectric layer to form the buried collar.

10 Claims, 8 Drawing Sheets

METHOD OF FABRICATING A BURIED COLLAR

BACKGROUND OF INVENTION

The present invention relates to the field of semiconductor fabrication; more specifically, it relates to method for fabricating a buried collar in a trench.

One use for buried collars is for device isolation and suppression of vertical parasitic leakage in trench dynamic random access memory (DRAM) structures. The thickness of the collar is fixed by the operating voltage of the device. As dimensions shrink, the diameter of the trench is shrinking faster than the operating voltage so a higher and higher percentage of the trench cross-section is taken up by the collar. Present techniques for fabricating collars do not work if the trench diameter is about three times the collar thickness.

SUMMARY OF INVENTION

A first aspect of the present invention is a method of forming a buried collar on a sidewall of a trench in a semiconductor substrate comprising: (a) providing the trench in the semiconductor substrate, the trench having a first dielectric layer formed on the sidewall in a upper region of the trench and a conductive material filling a lower region of the trench and a portion of the upper region of the trench, the conductive material covering a lower portion of the first dielectric layer; (b) removing the first dielectric layer not covered by the conductive material whereby a portion of the sidewall in the upper region is exposed; (c) forming a second dielectric layer on the exposed sidewall of the upper region and on a top surface of the conductive material; (d) removing an uppermost portion of the second dielectric layer from the sidewall in the upper region; (e) forming a third dielectric layer on the exposed sidewall of the upper region; and (f) increasing the thickness of the second dielectric layer to form the buried collar.

A second aspect of the present invention is a method of forming a buried collar on a sidewall of a trench in a semiconductor substrate comprising: (a) providing the trench in the semiconductor substrate, the trench having a first dielectric layer formed on the sidewall in an upper region of the trench and a conductive material filling a lower region of the trench and a portion of the upper region of the trench, the conductive material covering a lower portion of the first dielectric layer; (b) forming an amorphous silicon layer on the first dielectric material and on a top surface of the conductive material; (c) forming a second dielectric layer on the amorphous silicon layer; (d) removing an uppermost portion of the second dielectric layer leaving an exposed portion of the amorphous silicon layer in the upper region; (e) forming a third dielectric layer on the exposed portion of the amorphous silicon layer; (f) removing the second dielectric layer, the amorphous silicon layer and the first dielectric layer where the amorphous silicon layer is not covered by the third dielectric layer whereby a portion of the sidewall in the upper region is exposed; and (g) forming the buried collar on the exposed sidewall.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION

Figure 1A:
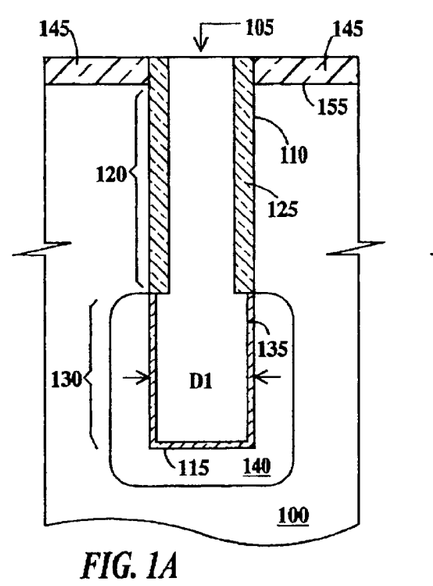
FIGS. 1A to 1N are partial cross-sectional views illustrating fabrication of a buried collar according to a first embodiment of the present invention.
Figure 1B:
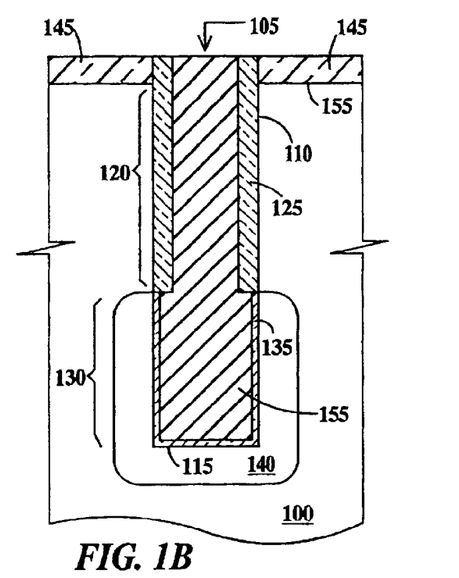
Figure 1C:
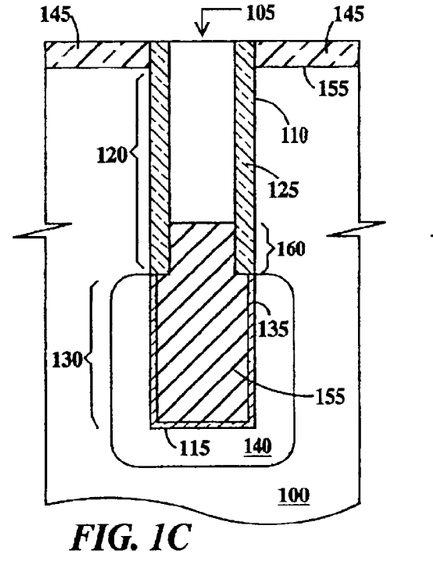
Figure 1D:
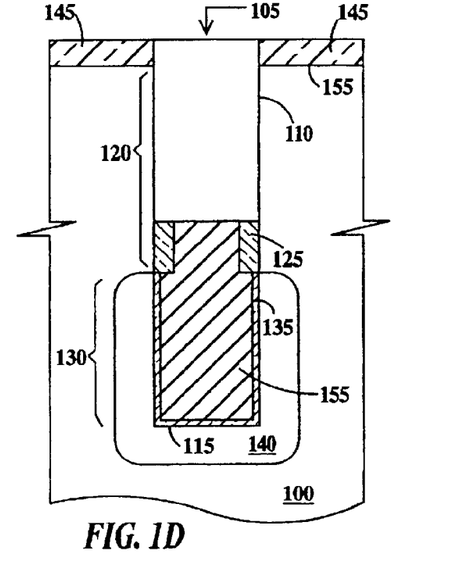
Figure 1E:
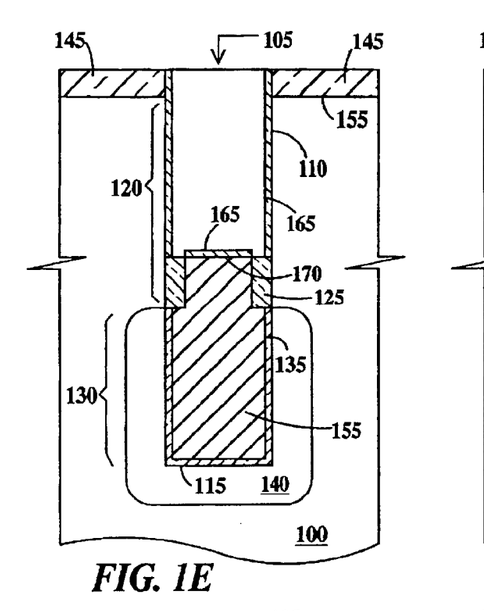
Figure 1F:
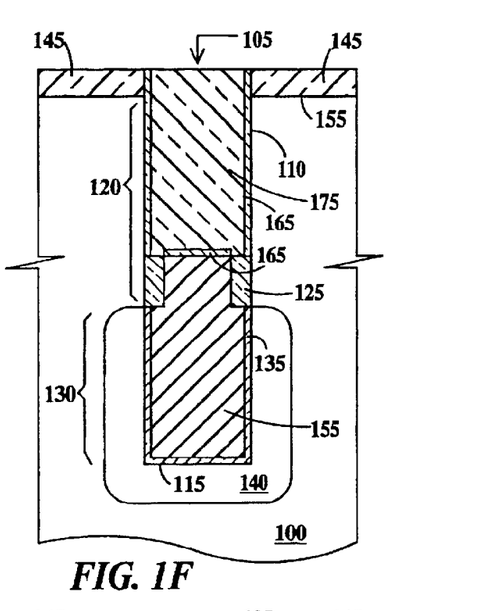
Figure 1G:
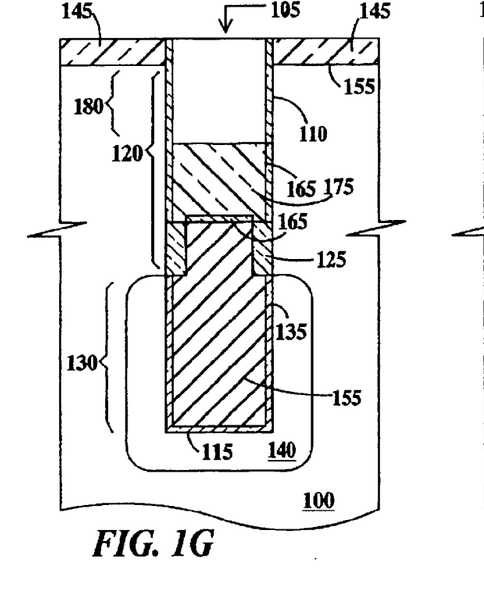
Figure 1H:
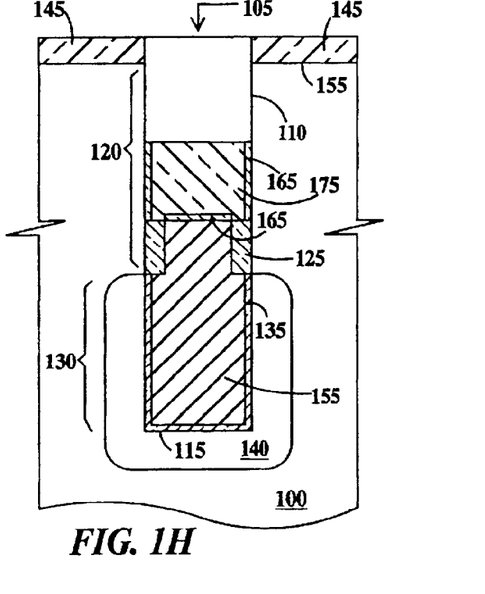
Figure 1I:
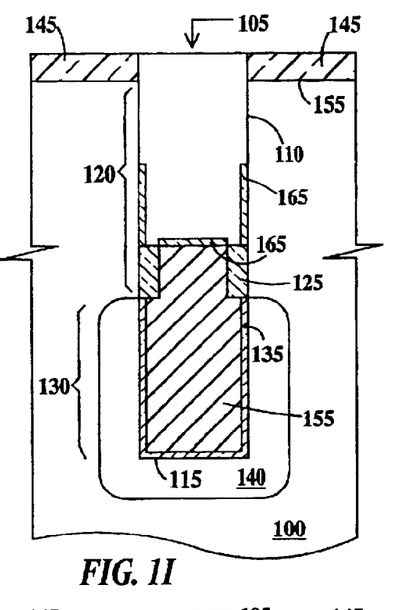
Figure 1J:
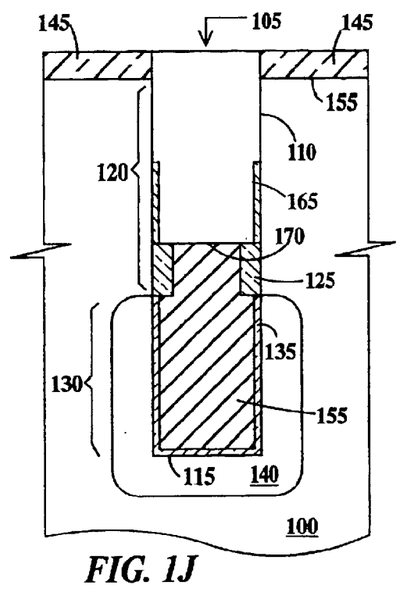
Figure 1K:
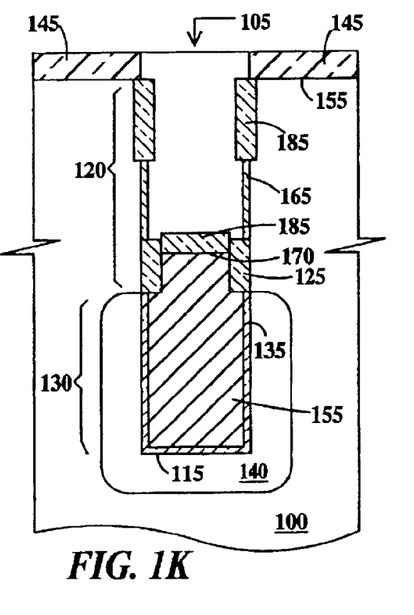
Figure 1L:
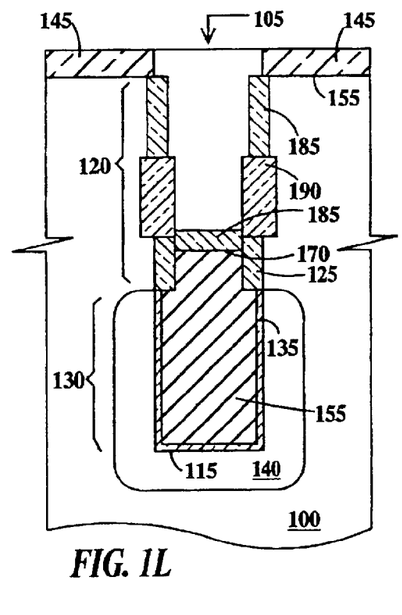
Figure 1M:
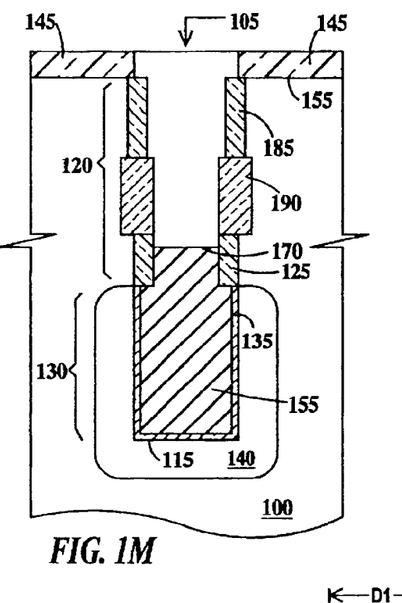
Figure 1N:
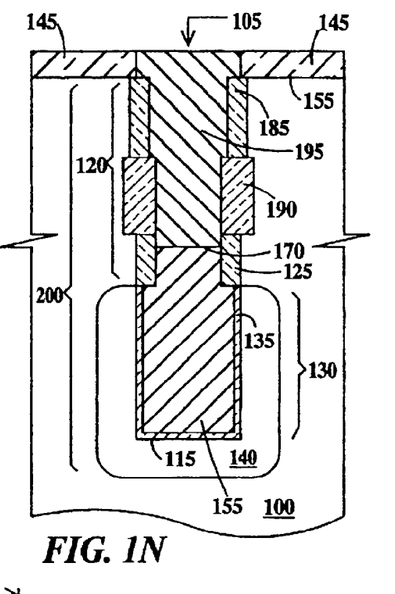

FIGS. 1A to 1N are partial cross-sectional views illustrating fabrication of a buried collar according to a first embodiment of the present invention. In FIG. 1A, formed in a substrate 100 is a trench 105 having a sidewall 110 and a bottom 115. Formed on sidewall 110 in an upper portion of 120 of trench 105 is a first dielectric layer 125. First dielectric layer 125 may be considered a sacrificial collar since it will be partially removed in subsequent processing steps describe infra. Formed on sidewall 110 in a lower portion 130 of trench 105 and on bottom 115 is a second dielectric layer 135. Lower portion 130 of trench 105 is surrounded by an optional doped region 140. Substrate 100 may be a bulk silicon substrate or a silicon layer on a silicon-on-insulator (SOI) substrate. Substrate 100 may include various structures such silicon-compound layers (e.g. silicon-germanium SiGe layer or SiGe-on-insulator layer), strained layers, isolation structures, dopant wells, and epitaxial layers.

Trench 105 is formed through an opening in masking layer 145 formed on a top surface 150 of substrate 100 by plasma etch processes well know in the art. First dielectric layer 125 is formed on upper portion 120 of trench 105 by methods well known in the art. In one example, first dielectric layer 125 is comprised of about 30 Å to 200 Å of $Si_3N_4$. Optional doped region 140 can be formed in the lower portion of the trench using first dielectric layer 125 as a diffusion mask. Doped region 140 can be formed by known techniques such as gas phase doping or solid source doping of lower portion 130 of trench 105 while top portion 120 is protected by first dielectric layer 125. Second dielectric layer 135 is formed in lower portion 130 of trench 105 after formation of doped region 140, consequently second dielectric layer 135 is also formed on top of first dielectric layer 125. The presence of second dielectric layer 135 on top of first dielectric layer 125 is not explicitly shown in FIG. 1A since the material of second dielectric becomes, depending upon the chemical composition of the first and second dielectric layers, incorporated into the first dielectric layer and/or the surface of the first dielectric layer. In one example, second dielectric layer 135 is comprised of about 10 to 100 Å of $Si_3N_4$ and about 20 to 100 Å of $SiO_2$, $SiO_xN_y$, a high K dielectric such as $HfO_2$, $ZrO_2$ or $Al_2O_3$ or a metal silicate such as $HfSi_xO_y$ or $HfSi_xO_yN_z$ which may be formed by any number of deposition methods known in the art, or by oxidation and nitridation techniques. In one example, trench 105 has a diameter D1 of about 100 Å or less, though the present invention is applicable to trenches having diameters greater than 1000 Å. In one example, substrate 100 is P-type (B) to a concentration of about $10^{15}$ to $10^{17}$ atm/cm$^3$ and doped region 140 is N-type (As or P) to a concentration of about $10^{19}$ to $10^{21}$ atm/cm$^3$.

In FIG. 1B, trench 105 is filled with conductive fill 155 by deposition followed by a chemical mechanical polish (CMP) to masking layer 145 or by reactive ion etch (RIE) and/or wet etch back technique to below the masking layer. Examples of suitable materials for conductive fill 155 include polysilicon, doped polysilicon, metals such as tungsten, metal suicides such as WSi, metal nitrides such as TaN or TiN, or a combination thereof. The fill-etch back process sequence can be optionally repeated to form multiple layers of different materials in the vertical direction. For example, trench 105 may be partially filled with a metal containing material followed by filling with silicon containing such as polysilicon. Since the first (and the second) embodiment of the present invention utilizes polysilicon as an exemplary fill material, conductive fill 155 will henceforth be referred to as polysilicon fill 155. In FIG. 1C, polysilicon fill 155 is RIE recess etched to remove a portion of the polysilicon from trench 105. However, a lower portion 160 of first dielectric layer 125 remains covered by the polysilicon. In FIG. 1D, the portion of first dielectric 125 not covered by polysilicon fill 155 is removed using an isotropic etch which may be a sequence of wet etches or a substantially non-directional plasma etch. In the present example, the polysilicon fill 155 forms a first doped electrode or plate of a trench capacitor, doped region 140 becoming the second doped electrode or plate.

In FIG. 1E, a third dielectric layer 165 is formed on exposed sidewall 110 and exposed top surface 170 of polysilicon fill 155. In one example, third dielectric layer 165 is about 50 to 200 Å of thermal $SiO_2$, tetraethoxysilane (TEOS) oxide or high temperature oxide (HTO) ($SiO_2$) or a combination thereof. In FIG. 1F, a spin-on material 175 such as polymeric materials including photoresist, antireflective coatings (ARC), or various resins is formed on top of polysilicon fill 155 to fill trench 105. In FIG. 1G, Spin-on material 175 is RIE recess etched or wet etched to expose third dielectric layer 165 in an upper portion 180 of upper portion 120 of trench 105. In FIG. 1H, third dielectric layer 165 not covered by spin-on material 175 is removed, for example, by wet or dry vapor etching. In FIG. 1I, spin-on material 175 (see FIG. 1H) is removed using a process that does not significantly oxidize silicon. An example of such a process is either a water rinse for water soluble materials (e.g. certain ARCs), or organic solvent rinse for certain resins, or exposure to a reducing ambient plasma (hydrogen or forming gas, a mixture of hydrogen and nitrogen), for certain photoresist materials.

In FIG. 1J, third dielectric layer 165 on top surface 170 of polysilicon fill 155 (see FIG. 1I) is removed using an RIE process. In FIG. 1K, a nitridation process is performed to form a fourth dielectric layer 185 on exposed sidewall 110 of trench 105 and on exposed top surface 170 of polysilicon fill 155. In one example, fourth dielectric layer is about 10 to 100 Å of $SiO_xN_y$ with a low concentration of oxygen (preferably less than 20 atomic percent) or a layer of $Si_3N_4$.

The amount of oxygen in the $SiO_xN_y$ depends upon how well any oxygen on the exposed silicon surfaces is removed prior to nitridation. One method of removing oxygen from silicon surfaces is surface cleaning in HF-containing mixture. The process parameters of such HF clean (e.g. HF dilution and process time) should be selected to remove any oxide formed on exposed silicon surfaces while keeping thickness of third dielectric layer 165 above 30 Å and preferably about 60 Å. One example of such HF-clean is a 180-second etch in the HF water solution with HF to water molar ratio of about 1:200. Such clean removes approximately 45 Å to 60 Å of oxide from third dielectric layer 165.

In the above clean example, in order to account for the oxide loss of third dielectric layer 165, the thickness of third dielectric layer 165 is chosen to be around 120 Å. Alternatively, a dry cleaning process may, for example, using HF vapor may be used. Cleaned silicon surfaces may react with ambient air moisture to undesirably form a thin layer of native oxide. Formation of native oxide can be reduced or eliminated by either shortening exposure to the ambient air, or clustering cleaning and nitridation equipment on the same platform to allow for a vacuum wafer transfer, or employing an organic surfactant in the cleaning mixture to form a soft surface protective layer. Another method of removing oxygen from silicon surfaces is heating in a reducing atmosphere such as a vacuum, hydrogen or forming gas. This method can be combined with an HF-based cleaning step to remove any remaining or regrown oxide directly prior to the nitridation step.

In one example, the nitridation processes is performed at about 900 to 1200° C. in $NH_3$ or $N_2H_4$ atmosphere. In a second example, the nitridation process is performed at about 25 to 1200° C. in an atmosphere containing nitrogen radicals such as $NH_x$ (x<3) and N (atomic nitrogen). Nitrogen radicals are typically produced with an excitation-assisted process where the excitation can be in the form of plasma (including remote plasmas), intense short wavelength radiation, intense heat, and electron beam. As long as third dielectric layer 165 is a silicon oxide layer, nitridation of the silicon under the silicon oxide will be substantially reduced and worst-case third dielectric layer 165 will be converted to $SiO_xN_y$ with a low concentration of nitrogen of less than about 20 atomic percent.

In FIG. 1L, a thermal oxidation is performed such that third dielectric layer 165 is replaced/converted to an $SiO_2$ buried collar 190 having a thickness of about 200 to 400 Å. It should be noted that the oxidation rate of fourth dielectric layer 185 is much lower than that of the silicon substrate yielding thickness differential between buried collar 190 and fourth dielectric layer 185 after the oxidation. Nevertheless, a portion of fourth dielectric layer 185 is converted to an oxynitride with a low concentration of nitrogen. In FIG. 1M, fourth dielectric layer 185 (on exposed top surface 170 of polysilicon fill 155, see FIG. 1L) is removed using a directional RIE process. In FIG. 1N, a conductive material 195 is deposited on polysilicon fill 155 to fill trench 105 and a trench capacitor 200 with a buried collar 190 is complete. In one example, conductive material 195 is polysilicon, doped polysilicon, an elemental metal such as tungsten, a metal suicide such as WSi, a metal nitride such as TaN or TiN, or a combination thereof.

Figure 2:
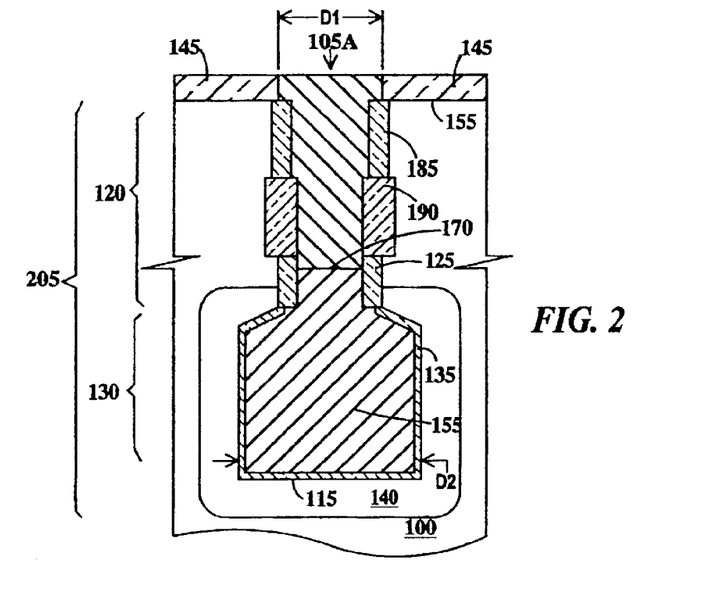
FIG. 2 is a partial cross-section view illustrating the present invention applied to a bottle trench.

FIG. 2 is a partial cross-section view illustrating the present invention applied to a bottle trench 105A. In FIG. 2, bottle trench capacitor 205 is similar to trench capacitor 200 of FIG. 1N and is formed by the same steps illustrated in FIGS. 1A through 1N. One difference being that while trench capacitor 200 has a diameter D1 in both upper portion 120 and lower portion 130 of trench 105 (see FIG. 1A), bottle trench capacitor has a diameter D1 in upper portion 120 and a diameter D2 in lower portion of bottle trench 105A, where D2 is greater than D1. Additionally, at least two etch steps are required to form bottle trench 105A, upper portion 120 being etched, a protective layer formed on the sidewalls and bottom portion 130 being etched.

Figure 3A:
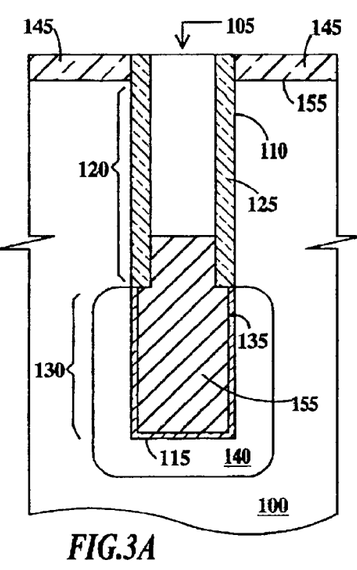
FIGS. 3A to 3H are partial cross-sectional views illustrating fabrication of a buried collar according to a second embodiment of the present invention.
Figure 3B:
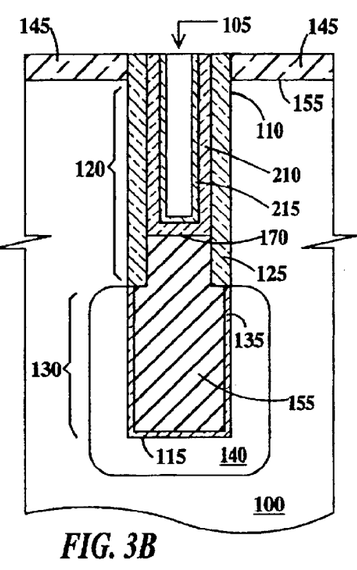
Figure 3C:
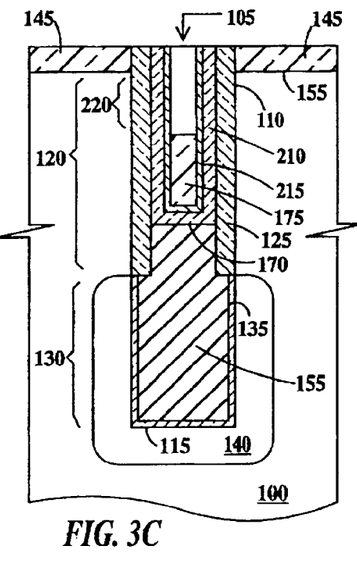
Figure 3D:
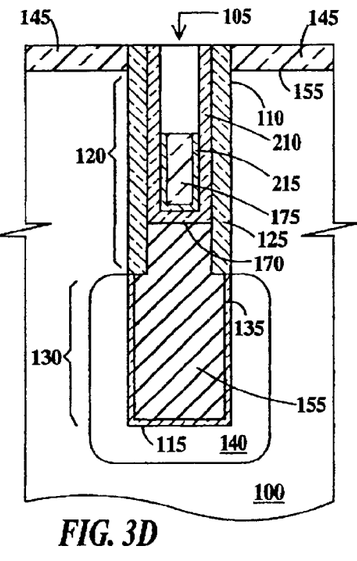

FIGS. 3A to 3H are partial cross-sectional views illustrating fabrication of a buried collar according to a second embodiment of the present invention. FIG. 3A is identical to FIG. 1C described supra. In FIG. 3B, a layer of amorphous silicon 210 is deposited on exposed portions of first dielectric layer 125 and on top surface 170 of polysilicon fill 155. First dielectric layer 125 must be cleaned prior to amorphous silicon deposition, any oxide-based and/or high-k layer (including incorporated oxygen containing portions of second dielectric layer 135 as discussed supra) present on the surface of the exposed portion of first dielectric layer 125 is removed by an aggressive HF-based etch. In the case of high-k material, the layer can be optionally damaged prior to etching by implanting heavy ions (e.g. Ar+) or exposing to plasma to speed up the removal process. As the result, the exposed portion of first dielectric layer 125 prior to amorphous Si deposition is, after cleaning, comprised of silicon nitride. A third dielectric layer 215 is formed on top of amorphous silicon layer 210. In one example, amorphous silicon layer 210 is about 50 to 200 Å thick and second dielectric layer is $Si_3N_4$ and is 20 to 100 Å thick. In FIG. 3C, a trench 105 is filled with spin-on material 175 such as polymeric materials including photoresist, antireflective coating (ARC), polymeric resins, or spin-on glass (SOG) and is RIE recess etched or wet etched to an upper portion 220 of third dielectric layer 215. In FIG. 3D, exposed upper portion 220 of third dielectric layer 215 is removed.

Figure 3E:
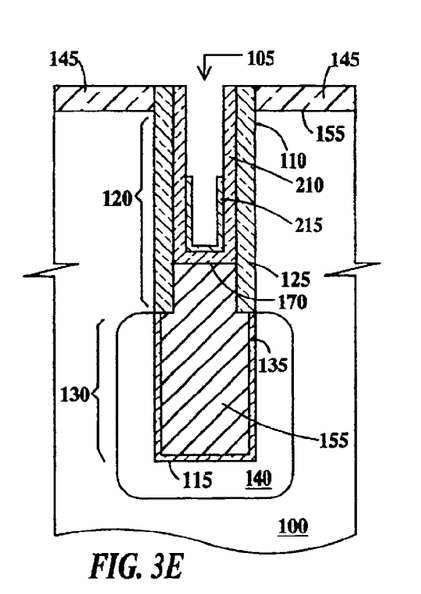
Figure 3F:
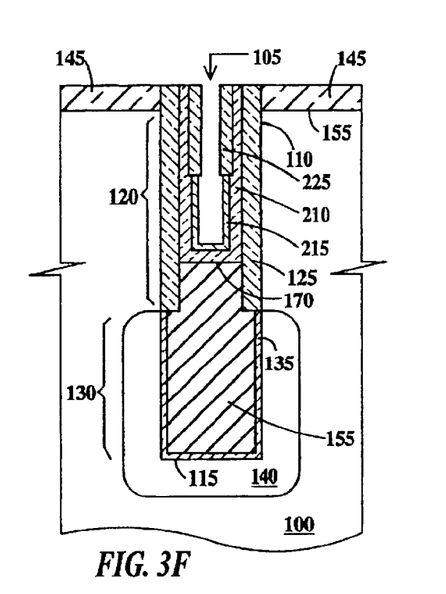
Figure 3G:
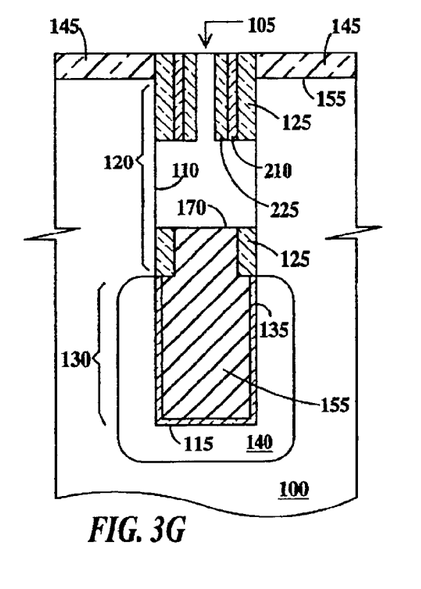

In FIG. 3E, spin-on material 175 (see FIG. 3D) is removed. In FIG. 3F, a dry oxidation process is performed to form a fourth dielectric layer 225 on exposed regions of amorphous silicon layer 210. In one example, third dielectric layer is $SiO_2$ and is about 50 to 200 Å thick. It should be noted that the exposed amorphous silicon 210 can be optionally and fully consumed (oxidized) at this step. Further, the oxidation rate of amorphous silicon 210 is much faster than that of third dielectric layer 215 resulting in a surface oxide formed on third dielectric layer 215 of less than about 15 Å. In FIG. 3G, exposed (not covered by fourth dielectric layer 225 or polysilicon fill 155) third dielectric layer 215 and underlying regions of amorphous silicon layer 210 and first dielectric layer 125 are removed from sidewall 110 and from top surface 170 of polysilicon fill 155.

One example of a removal process includes a sequence of isotropic etches as follows when third dielectric layer 215 is $Si_3N_4$ and fourth dielectric layer 225 is $SiO_2$ is: (1) the oxidized surface of third dielectric layer 215 is deglazed in an HF-containing environment (this etch is not selective to fourth dielectric layer 225 but very short), (2) third dielectric layer 215 is etched in a hot phosphoric acid ($H_3PO_4$) solution selective to fourth dielectric layer 225, (3) the surface of amorphous silicon layer 210 is deglazed in an HF-containing environment to remove any surface oxide layer, (4) amorphous silicon layer 210 is etched in $NH_4OH$ solution which is selective to fourth dielectric layer 225, (5) the surface of first dielectric layer 125 is deglazed in an HF-containing environment to remove any surface oxide, and (6) first dielectric layer 125 is etched in hot $H_3PO_4$ solution selective to fourth dielectric layer 225. In the above example, the thickness of fourth dielectric layer 225 should be substantially larger than the oxide loss in all HF-based deglazes. Because the preferred surface deglaze processes remove about 20 Å of oxide, the thickness of fourth dielectric layer 225 should above 100 Å, in the above example. Fourth dielectric layer 225 and amorphous silicon layer 210 can optionally be removed prior to collar formation. Alternatively, only the fourth dielectric layer 225 can be removed prior to collar formation.

Figure 3H:
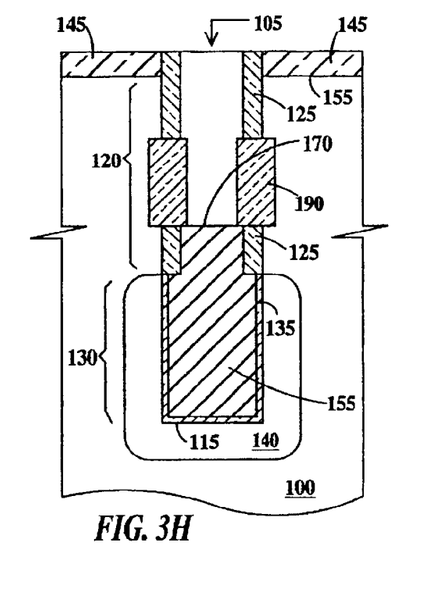

In FIG. 3H, an oxidation is performed to form $SiO_2$ buried collar 190 having a thickness of about 200 to 400 Å and fourth dielectric layer 225 and amorphous silicon layer 210 are removed. It should be noted that any remaining amorphous silicon layer 210 would be completely oxidized during the collar oxidation step. The resultant silicon oxide can be easily removed with a short HF-based etch. Alternatively, a thin oxide layer can be left on top of first dielectric layer 125 to be removed in subsequent processing steps. It should also be noted that the oxidation rate of first dielectric layer 125 (when it is $Si_3N_4$) is much slower than that of exposed silicon substrate 100.

The processes illustrated in FIG. 1N and described supra are performed to complete the second embodiment of the present invention. The second embodiment of the present invention is also applicable to bottle trenches.

Figure 4:
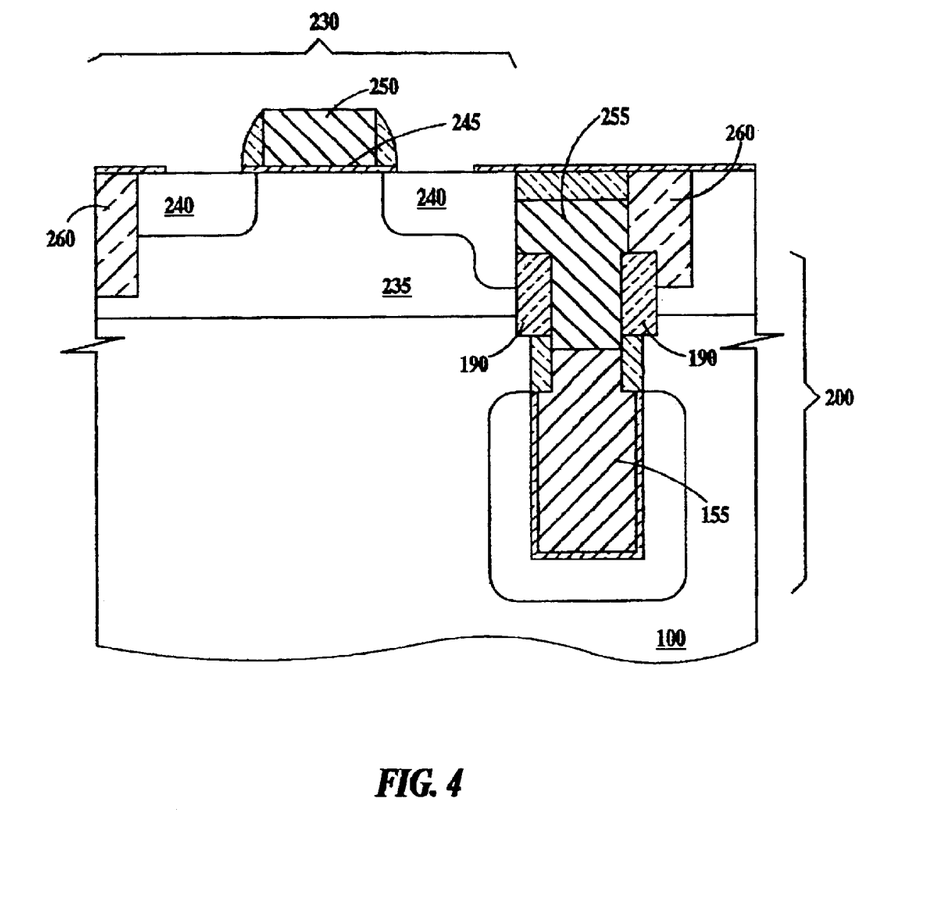
FIG. 4 is a partial cross-sectional view after the further steps of forming a lateral field effect transistor (FET) according to the present invention.

FIG. 4 is a partial cross-sectional view after the further steps of forming a lateral FET 230 according to the present invention. In FIG. 4, lateral FET 230 including a well 235, source/drains 240, gate dielectric 245 and gate 250 is formed in substrate 100 by any number of processes known to one of ordinary skill in the art. Additionally a buried strap 255 is formed over buried collar 190 and electrically contacting polysilicon fill 155 of trench capacitor 200. The combination of lateral FET 230 and trench capacitor 200 is isolated by shallow trench isolation (STI) 260. Lateral FET 230 is exemplary of lateral FETs in general, and any lateral FET of differing structure may be substituted for lateral FET 230. Trench capacitor 200 may be fabricated by either the first or the second embodiment of the present invention and bottle trench capacitor 205 (see FIG. 2) may be substituted for trench capacitor 200.

Figure 5:
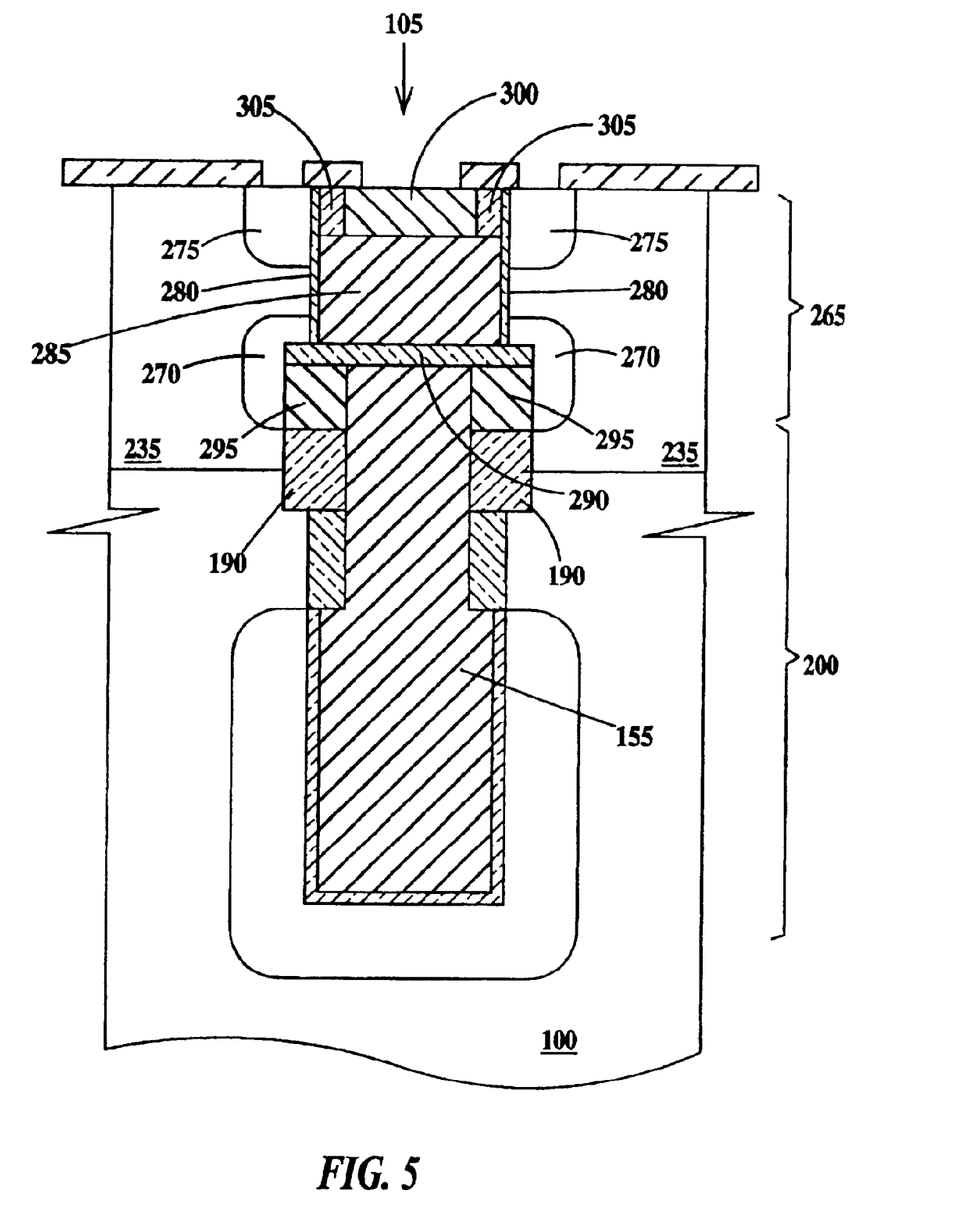
FIG. 5 is a partial cross-sectional view after the further steps of forming a vertical FET according to the present invention.

FIG. 5 is a partial cross-sectional view after the further steps of forming a vertical FET 265 according to the present invention. In FIG. 5, vertical FET 265 includes lower source/drains 270 and upper source/drains 275 formed in well 235, a gate dielectric 280 and a polysilicon gate 285 (or other conductor) is formed in trench 105 in substrate 100 by any number of processes known to one of ordinary skill in the art. Gate 285 is separated from polysilicon fill 155 by a dielectric plug 290 and lower source/drains 270 are electrically connected to polysilicon fill 155 by polysilicon ring 295 formed above buried collar 190. A conductive gate contact 300 separated from gate dielectric 280 by a dielectric ring 305 electrically contacts gate 285. Vertical FET 265 is exemplary of vertical FETs in general, and any vertical FET of differing structure may be substituted for lateral FET 265. Trench capacitor 200 may be fabricated by either the first or the second embodiment of the present invention and bottle trench capacitor 205 (see FIG. 2) may be substituted for trench capacitor 200.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of forming a buried collar on a sidewall of a trench in a semiconductor substrate comprising:

(a) providing said trench in said semiconductor substrate, said trench having a first dielectric layer formed on said sidewall in a upper region of said trench and a conductive material filling a lower region of said trench and a portion of said upper region of said trench, said conductive material covering a lower portion of said first dielectric layer;

(b) removing said first dielectric layer not covered by said conductive material whereby a portion of said sidewall in said upper region is exposed;

(c) forming a second dielectric layer on said exposed sidewall of said upper region and on a top surface of said conductive material;

(d) removing an uppermost portion of said second dielectric layer from said sidewall in said upper region;

(e) forming a third dielectric layer on said exposed sidewall of said upper region; and (f) increasing the thickness of said second dielectric layer to form said buried collar.

2. The method of claim 1, further including:

(g) removing said second dielectric layer from said top surface of said conductive material; and (h) filling said upper region with an additional conductive material.

3. The method of claim 1, wherein step (d) includes in the order recited:

filling said trench with a spin-on material; and removing an upper portion of said spin-on-material.

4. The method of claim 1, wherein step (c) includes performing a thermal oxidation process, forming a high temperature oxide on said exposed sidewall or depositing an oxide on said exposed sidewall.

5. The method of claim 1, wherein step (e) includes performing a nitridation process to form said third dielectric layer.

6. The method of claim 1, wherein said first dielectric layer comprises silicon nitride, said second dielectric layer comprises silicon oxide, said third dielectric layer comprises silicon nitride and said conductive material is comprised of polysilicon.

7. The method of claim 1, wherein said collar is 200 to 400 Å thick and said trench is 1000 Å or less in diameter.

8. The method of claim 1, further including:

before step (a) forming a doped region in said semiconductor substrate, said doped region surrounding said lower region of said trench and forming a fourth dielectric layer on said sidewall of said trench in said lower region of said trench; and before step (b) doping said conductive material by diffusion from said doped region through said fourth dielectric layer into said conductive material.

9. The method of claim 1, wherein said lower region of said trench is wider than said upper region of said trench.

10. The method of claim 1, further including forming a vertical transistor in said trench above said buried collar.

* * * * *